US011038031B2

(12) United States Patent
Watanabe

(10) Patent No.: US 11,038,031 B2
(45) Date of Patent: Jun. 15, 2021

(54) FIELD-EFFECT TRANSISTOR

(71) Applicant: Mitsubishi Electric Corporation, Tokyo (JP)

(72) Inventor: Shinsuke Watanabe, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/498,349

(22) PCT Filed: Sep. 1, 2017

(86) PCT No.: PCT/JP2017/031625
§ 371 (c)(1),
(2) Date: Sep. 26, 2019

(87) PCT Pub. No.: WO2019/043918
PCT Pub. Date: Mar. 7, 2019

(65) Prior Publication Data
US 2021/0036115 A1    Feb. 4, 2021

(51) Int. Cl.
*H01L 29/417*    (2006.01)
*H01L 23/66*    (2006.01)
*H01L 29/423*    (2006.01)

(52) U.S. Cl.
CPC ........ *H01L 29/41758* (2013.01); *H01L 23/66* (2013.01); *H01L 29/4238* (2013.01); *H01L 2223/6627* (2013.01)

(58) Field of Classification Search
CPC ........... H01L 29/41758; H01L 29/4238; H01L 23/66; H01L 2223/6627
See application file for complete search history.

(56) References Cited

U.S. PATENT DOCUMENTS

2004/0155728 A1    8/2004    Cheung et al.
2004/0164407 A1*   8/2004    Nakajima ........... H01L 23/5227
                                                                 257/724
(Continued)

FOREIGN PATENT DOCUMENTS

JP    H04-116836 A    4/1992
JP    2001-044219 A    2/2001
(Continued)

OTHER PUBLICATIONS

International Search Report; Written Opinion; and Notification of Transmittal of The International Search Report and The Written Opinion of The International Searching Authority, or The Declaration issued in PCT/JP2017/031625; dated Oct. 31, 2017.
(Continued)

*Primary Examiner* — Shaun M Campbell
(74) *Attorney, Agent, or Firm* — Studebaker & Brackett PC

(57) ABSTRACT

A field effect transistor according to the present invention includes a semiconductor substrate, a plurality of drain electrodes provided on a first surface of the semiconductor substrate and extending in a first direction, an input terminal, an output terminal, and a plurality of metal layers provided in the semiconductor substrate apart from the first surface and extending in a second direction crossing the first direction, in which the plurality of metal layers include a first metal layer and a second metal layer which is longer than the first metal layer and which crosses more drain electrodes than the first metal layer when seen from a direction perpendicular to the first surface, and among the plurality of drain electrodes, those having a smaller length of line from the input terminal to the output terminal are provided with more metal layers directly thereunder.

12 Claims, 11 Drawing Sheets

(56) References Cited

U.S. PATENT DOCUMENTS

| | | | |
|---|---|---|---|
| 2005/0068127 A1 | 3/2005 | Ham et al. | |
| 2009/0278207 A1* | 11/2009 | Greenberg | H01L 27/0207 257/386 |
| 2010/0171567 A1 | 7/2010 | Krishnaswamy et al. | |
| 2015/0349070 A1* | 12/2015 | Kawasaki | H01L 23/50 257/329 |
| 2017/0222004 A1* | 8/2017 | Sato | H01L 23/645 |
| 2017/0317012 A1 | 11/2017 | Imai et al. | |

FOREIGN PATENT DOCUMENTS

| | | |
|---|---|---|
| JP | 6067151 B2 | 1/2017 |
| TW | 200952120 A | 12/2009 |
| TW | 201108500 A | 3/2011 |

OTHER PUBLICATIONS

Office Action issued in TW 106143326; mailed by the Taiwan Intellectual Property Office dated Jun. 7, 2018.

Office Action issued in Tw 106143326; mailed by the Taiwan Intellectual Property Office dated Oct. 16, 2018.

An Office Action mailed by the Korean Patent Office dated Apr. 21, 2021, which corresponds to Korean Patent Application 10-2020-7004924 and is related to U.S. Appl. No. 16/498,349 with English language translation.

* cited by examiner

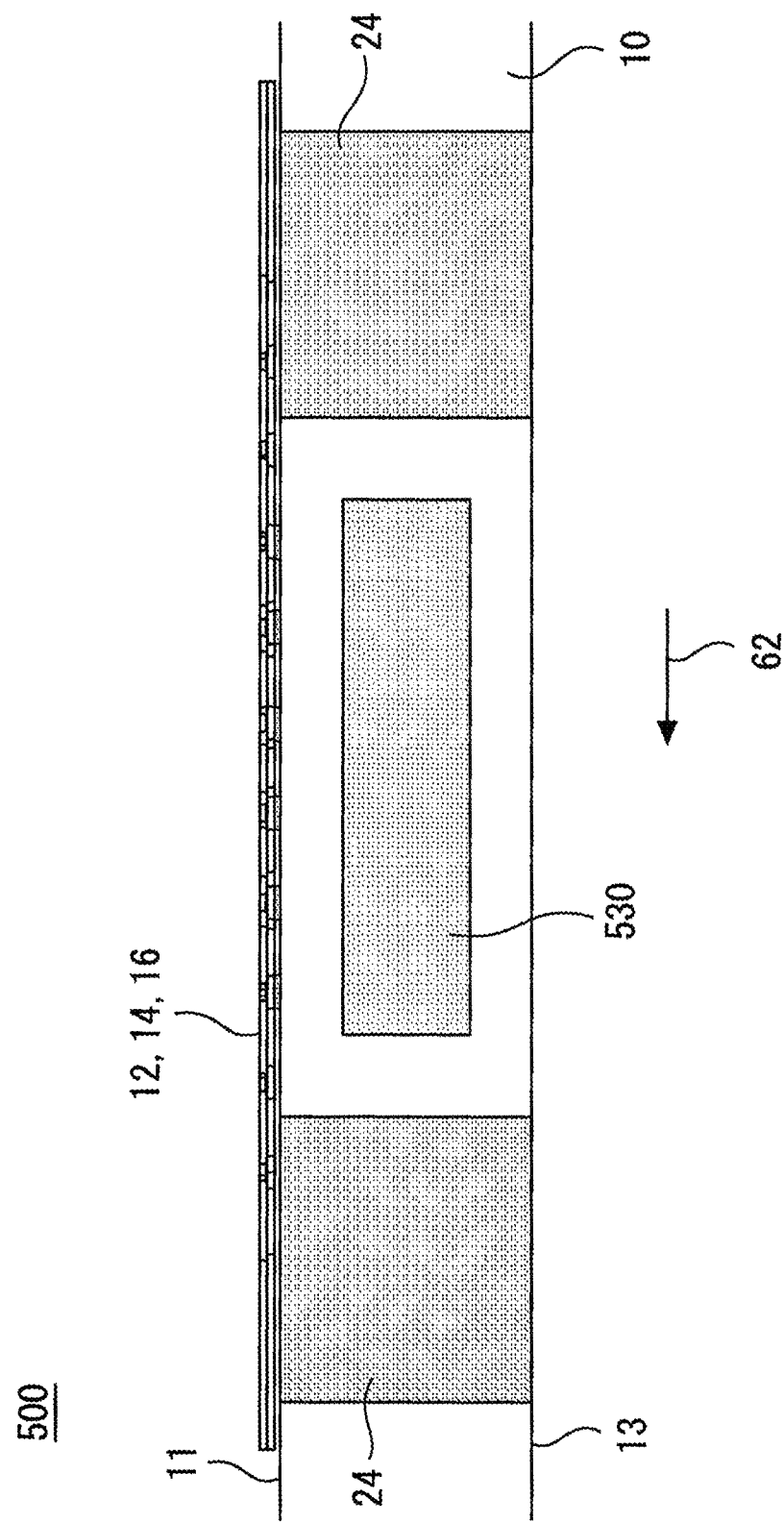

FIELD-EFFECT TRANSISTOR

FIELD

The present invention relates to a field-effect transistor.

BACKGROUND

PTL 1 discloses a field-effect transistor including a drain electrode, a source electrode and a gate electrode on a surface of a substrate. The drain electrode, the source electrode and the gate electrode are aligned in one direction. A strip-shaped metal layer extending in the alignment direction of the drain electrode, the source electrode, and the gate electrode is provided on a back surface side of the substrate. By providing a metal layer on the back surface side of the substrate and thinning the substrate below an active region, it would be expected that the heat dissipation property is enhanced. Furthermore, it would be possible to suppress reduction in mechanical strength of the field-effect transistor.

CITATION LIST

Patent Literature

[PTL 1] JP H4-116836 A

SUMMARY

Technical Problem

In a high frequency FET (Field Effect Transistor), an amplification operation may be performed by a plurality of fingers, and a plurality of high frequency signals output from the plurality of fingers may be combined with one another at an output terminal. In this case, in order to obtain a high-power high-frequency signal with a high power addition efficiency, the amplification operations in the respective fingers are required to be uniformly performed. When the plurality of high frequency signals are different in phase, the plurality of high frequency signals cannot be properly combined, which may cause reduction in output power and efficiency.

However, the electrical length from the input terminal to the finger and the electrical length from the finger to the output terminal are different among the fingers. Therefore, it is difficult to combine a plurality of high frequency signals in phase, and the performance may greatly deteriorate. As a countermeasure to suppress the deterioration of the performance, it is conceivable to add each finger with a matching circuit for equalizing the electric length at a central portion and a peripheral portion of FET. However, addition of the matching circuit to each finger may significantly increase the size of the FET.

Here, in a slow wave transmission line, the electrical length generally changes depending on the number of metal layers just below a signal line or the distance between the signal line and the metal layer. When a plurality of metal layers are formed just below an electrode in PTL 1, a structure similar to the structure of the slow-wave transmission line can be obtained. Therefore, it is conceivable for the field-effect transistor shown in PTL 1 that the electrical length of each finger is changed due to a metal layer just below the electrode.

However, in the structure of PTL 1, the number of metal layers just below the electrode is the same among all the fingers. Therefore, the electrical length of each finger is uniformly changed by the metal layer, so that the effect of equalizing the electrical lengths cannot be obtained. Furthermore, when the electrical length of each electrode increases, the potential difference in a direction in which the finger extends increases, so that the characteristics are likely to be degraded. In addition, when the electrical length of each electrode increases, resonance occurs inside FET and oscillation is likely to occur. In the structure of PTL 1, by making the metal layer closer to the drain electrode and the gate electrode, unnecessary parasitic capacitance may increase and the characteristics may be degraded.

As described above, simple application of the structure of the slow-wave transmission line to FET brings a great disadvantage except that the heat dissipation property can be improved when a substrate having a low thermal conductivity is used. In particular, when silicon carbide or gallium nitride having a high thermal conductivity is used as a substrate, a merit of improving the heat dissipation property is also degraded.

The present invention has been made to solve the above-mentioned problems, and has an object to obtain a field-effect transistor having high efficiency.

Solution to Problem

A field-effect transistor according to the present invention includes a semiconductor substrate, a plurality of drain electrodes that are provided on a first surface of the semiconductor substrate and extend in a first direction, a plurality of source electrodes that are provided on the first surface of the semiconductor substrate, extend in the first direction, and are alternately arranged with each other with the plurality of drain electrodes, a plurality of gate electrodes that are provided on the first surface of the semiconductor substrate, extend in the first direction, and are provided between the plurality of source electrodes and the plurality of drain electrodes, respectively, an input terminal connected to the plurality of gate electrodes, an output terminal connected to the plurality of drain electrodes and a plurality of metal layers that are provided in the semiconductor substrate apart from the first surface, extend in a second direction intersecting the first direction, and intersect the plurality of drain electrodes when viewed in a direction perpendicular to the first surface, wherein the plurality of metal layers include a first metal layer, and a second metal layer which is longer than the first metal layer and intersects a larger number of drain electrodes than the first metal layer when viewed in a direction perpendicular to the first surface, and a larger number of metal layers are provided just below a drain electrode having a shorter line length from the input terminal to the output terminal among the plurality of drain electrodes.

A field-effect transistor according to the present invention includes a semiconductor substrate, a plurality of drain electrodes that are provided on a first surface of the semiconductor substrate and extend in a first direction, a plurality of source electrodes that are provided on the first surface of the semiconductor substrate, extend in the first direction, and are alternately arranged with each other with the plurality of drain electrodes, a plurality of gate electrodes that are provided on the first surface of the semiconductor substrate, extend in the first direction, and are provided between the plurality of source electrodes and the plurality of drain electrodes, respectively, an input terminal connected to the plurality of gate electrodes, an output terminal connected to the plurality of drain electrodes and a plurality of metal layers that are provided in the semiconductor substrate apart from the first surface, extend in a second direction intersecting the first direction, and intersect the plurality of drain electrodes when viewed in a direction perpendicular to the first surface, wherein a distance between a drain electrode and the plurality of metal layers is shorter as the drain electrode has a shorter line length from the input terminal to the output terminal among the plurality of drain electrodes.

Advantageous Effects of Invention

In the field-effect transistor according to the invention of the present application, as a drain electrode has a shorter line length from an input terminal to an output terminal, a larger number of metal layers are provided just below the drain electrode. Here, the electrical length of a signal line is increased due to the capacitance generated between a plurality of drain electrodes and a plurality of source electrodes and a plurality of metal layers. Therefore, as a drain electrode has a shorter line length from the input terminal to the output terminal, a larger number of metal layers are provided just below the drain electrode, whereby the phase difference of signals at the output terminal can be suppressed. Accordingly, a field-effect transistor having high efficiency can be obtained.

In the field-effect transistor according to the invention of the present application, as a drain electrode has a shorter line length from the input terminal to the output terminal, the distances between the drain electrode and the plurality of metal layers are shorter. Here, the electrical length of the signal line is increased due to the capacitance generated between the plurality of drain electrodes and the plurality of source electrodes and the plurality of metal layers. Therefore, as a drain electrode has a shorter line length from the input terminal to the output terminal, the distances between the drain electrode and the plurality of metal layers are made shorter, whereby the phase difference of signals at the output terminal can be suppressed. Accordingly, a field-effect transistor having high efficiency can be obtained.

BRIEF DESCRIPTION OF DRAWINGS

FIG. 11 is a cross-sectional view of a field-effect transistor according to the third embodiment which is taken along the second direction.

DESCRIPTION OF EMBODIMENTS

Figure 1:
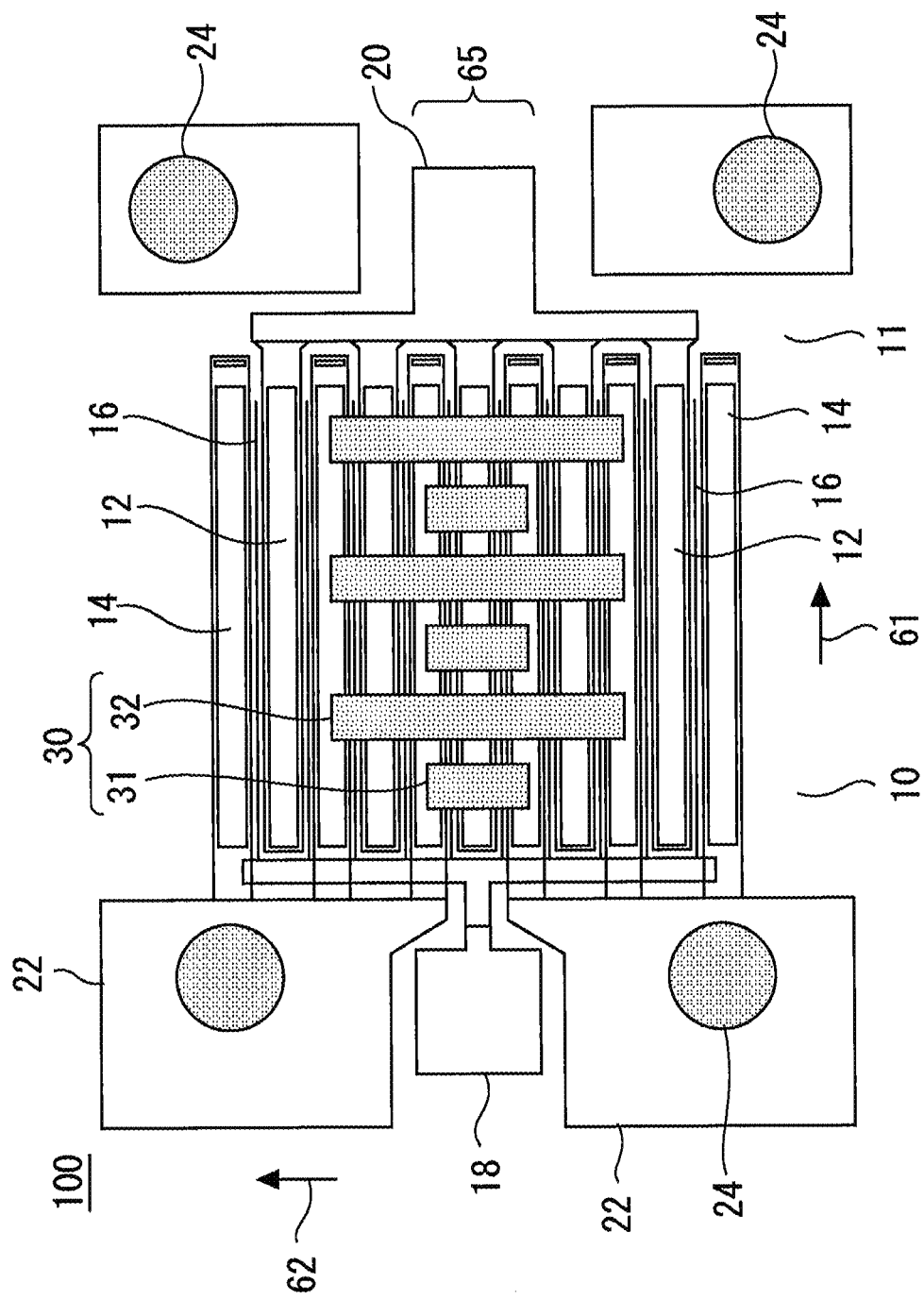
FIG. 1 is a plan view of a field-effect transistor according to a first embodiment.

A field-effect transistor according to an embodiment of the present invention are described with reference to drawings. Identical or corresponding constitutional elements are given the same reference numerals, and the repeated description of such constitutional elements may be omitted.

First Embodiment

FIG. 1 is a plan view of a field-effect transistor 100 according to a first embodiment. The field-effect transistor 100 is a high-frequency FET. The field-effect transistor 100 includes a semiconductor substrate 10. Silicon, silicon carbide, gallium arsenide, gallium nitride, indium phosphide, or the like can be used as a material of the semiconductor substrate 10.

A plurality of drain electrodes 12 are provided on a first surface 11 of the semiconductor substrate 10. The plurality of drain electrodes 12 extend in a first direction. The first direction is a direction indicated by an arrow 61. The drain electrodes 12 are made with metal. A plurality of source electrodes 14 are provided on the first surface 11 of the semiconductor substrate 10. The plurality of source electrodes 14 extend in the first direction. The source electrodes 14 are made with metal. The plurality of source electrodes 14 and the plurality of drain electrodes 12 are alternately arranged with each other.

A plurality of gate electrodes 16 are provided on the first surface 11 of the semiconductor substrate 10. The plurality of gate electrodes 16 extend in the first direction. The gate electrodes 16 are made with metal. The plurality of gate electrodes 16 are provided between the plurality of source electrodes 14 and the plurality of drain electrodes 12, respectively. The gate electrode 16 is also called a gate finger.

The plurality of gate electrodes 16 are connected to the input terminal 18. In addition, the plurality of drain electrodes 12 are connected to the output terminal 20. The plurality of source electrodes 14 are connected to source pads 22. The source pad 22 is provided with a via hole 24. The via holes 24 connect metals such as the source electrodes 14, etc. provided on the first surface 11 of the semiconductor substrate 10 to a back surface metal provided on a second surface which is a surface opposite to the first surface 11.

The via holes 24 are formed as follows. First, the semiconductor substrate 10 is processed to form holes penetrating the semiconductor substrate 10 from the first surface 11 to the second surface. Subsequently, the holes are filled with metal or plated.

The field-effect transistor 100 includes a plurality of metal layers 30. The plurality of metal layers 30 extend in a second direction intersecting the first direction. The second direction is a direction indicated by an arrow 62. In the present embodiment, the second direction is perpendicular to the first direction. The plurality of metal layers 30 intersect the plurality of drain electrodes 12 when viewed in a direction perpendicular to the first surface 11. The potential of the metal layers 30 may be ground or float. The plurality of metal layers 30 are arranged at equal intervals in the first direction.

The plurality of metal layers 30 include a first metal layer 31 and a second metal layer 32. The second metal layer 32 is longer than the first metal layer 31, and intersects a larger number of drain electrodes 12 than the first metal layer 31 when viewed in the direction perpendicular to the first surface 11. The plurality of metal layers 30 include a plurality of first metal layers 31 and a plurality of second metal layers 32, respectively. The plurality of first metal layers 31 and the plurality of second metal layers 32 are periodically arranged. In the present embodiment, the plurality of first metal layers 31 and the plurality of second metal layers 32 are alternately arranged with each other in the first direction.

The input terminal 18 and the output terminal 20 are provided at a central portion 65 of the semiconductor substrate 10 in a direction perpendicular to the first direction. The input terminal 18 and the output terminal 20 are provided to face each other across the plurality of drain electrodes 12. The plurality of metal layers 30 extend from just below the drain electrode 12 provided at the central portion 65 to both sides in the second direction. Note that FIG. 1 is a diagram of the field-effect transistor 100 when viewed from the second surface side.

Figure 2:
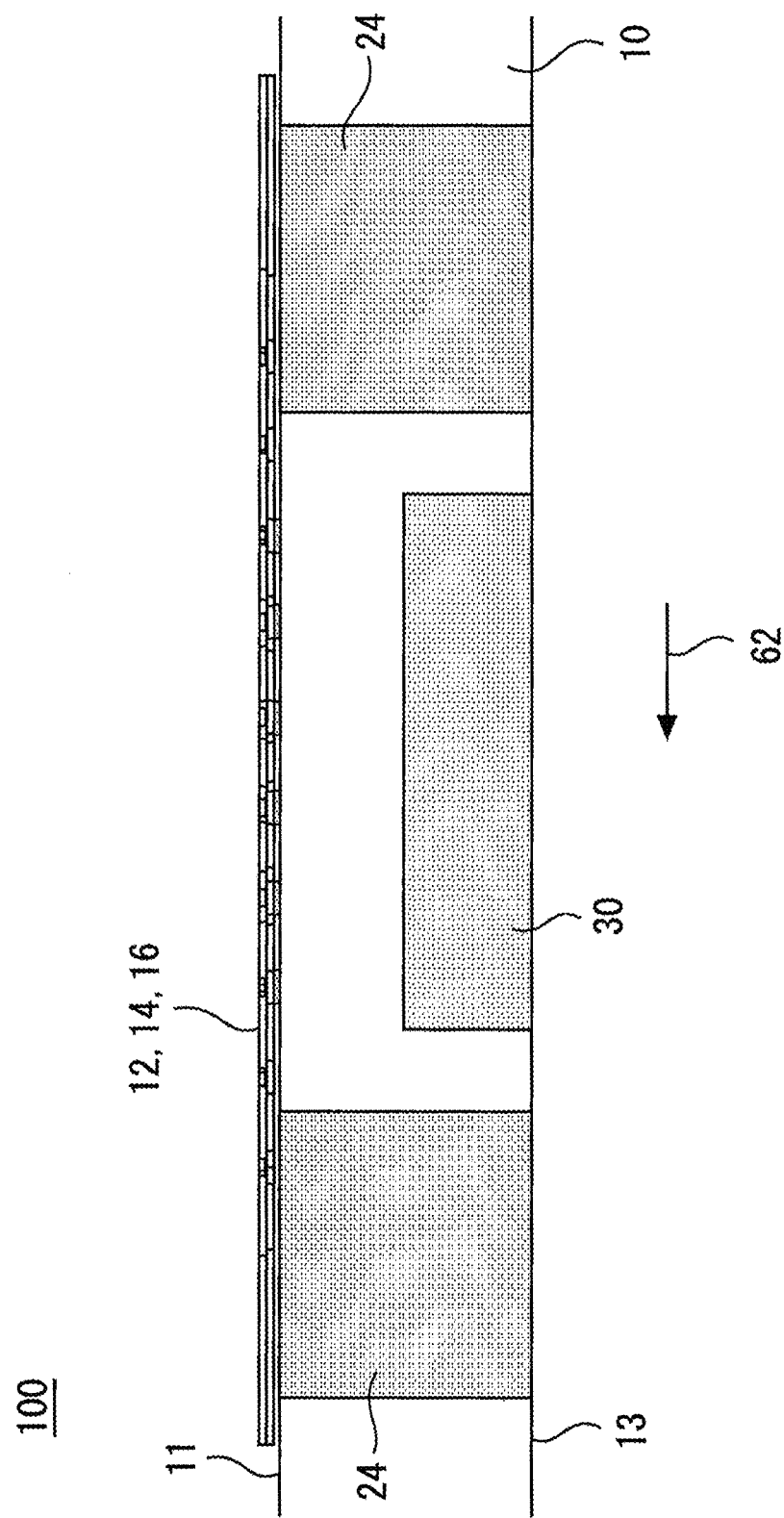
FIG. 2 is a cross-sectional view along the second direction of the field-effect transistor according to the first embodiment.

FIG. 2 is a cross-sectional view along the second direction of the field-effect transistor 100 according to the first embodiment. The plurality of metal layers 30 are provided on the second surface 13 of the semiconductor substrate 10. In addition, the plurality of metal layers 30 are provided in the semiconductor substrate 10 apart from the first surface 11. Each metal layer 30 is an unpenetrated via hole which is provided till a certain depth in a direction from the second surface 13 to the first surface 11 without completely penetrating the semiconductor substrate 10. A method of forming the metal layer 30 is the same as a method of forming the via hole 24 except that the hole is provided so as not to penetrate.

Figure 3:
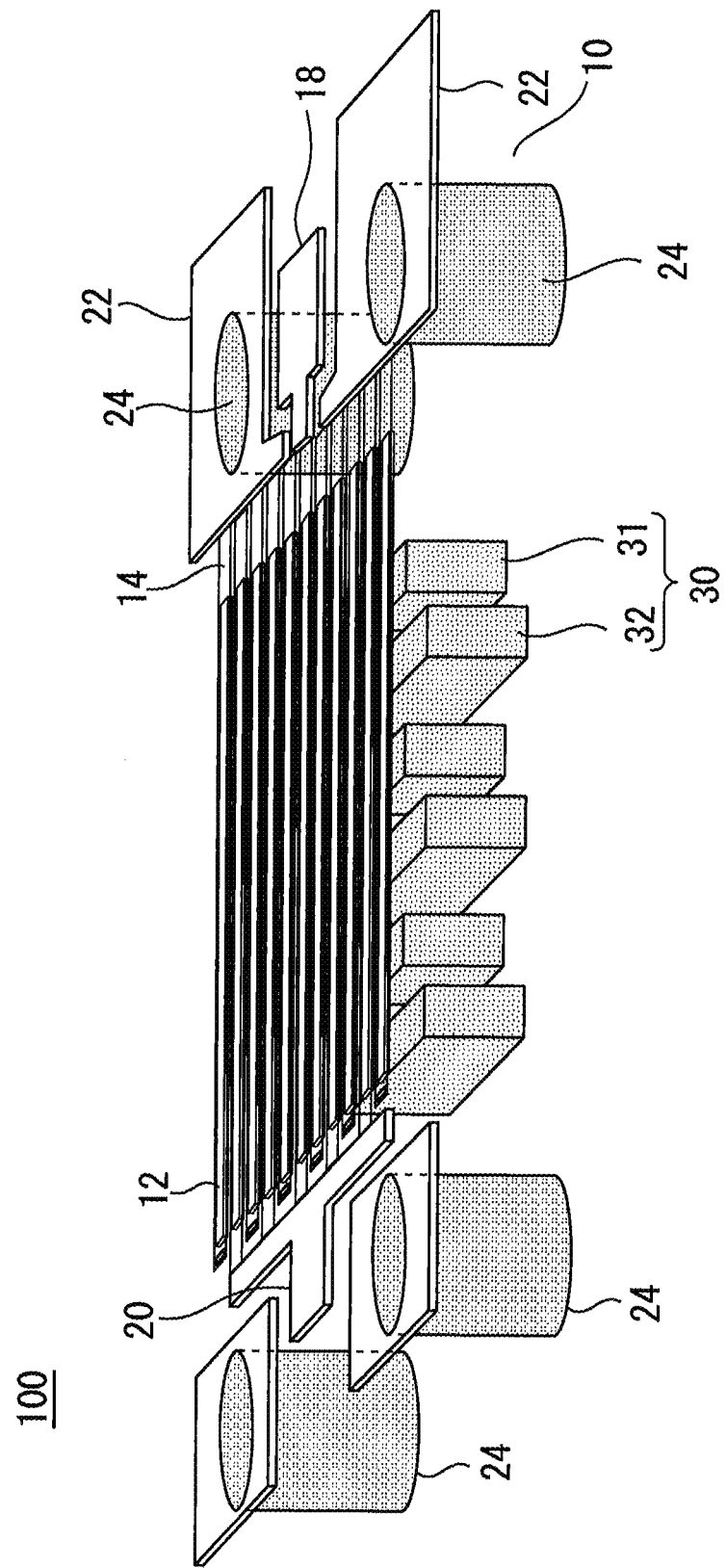
FIG. 3 is a perspective view of the field-effect transistor according to the first embodiment.

FIG. 3 is a perspective view of the field-effect transistor 100 according to the first embodiment. The via holes 24 are cylindrical. Each metal layer 30 is a rectangular parallelepiped. The shapes of the via holes 24 and the metal layers 30 are not limited to these shapes. Note that the gate electrodes 16 are omitted in FIG. 3.

A plurality of FETs extending in the first direction are formed in the field-effect transistor 100. The plurality of FETs are arranged in the second direction. Each FET is called a finger. The field-effect transistor 100 includes a plurality of fingers connected in parallel to one another.

In the field-effect transistor 100, a high frequency signal input from the input terminal 18 is distributed to the plurality of gate electrodes 16. The distributed high frequency signals are amplified at the plurality of fingers, respectively. Thereafter, the high frequency signals are combined with one another again at the output terminal 20. As a result, a high frequency signal of high power can be generated from the output terminal 20.

Figure 4:
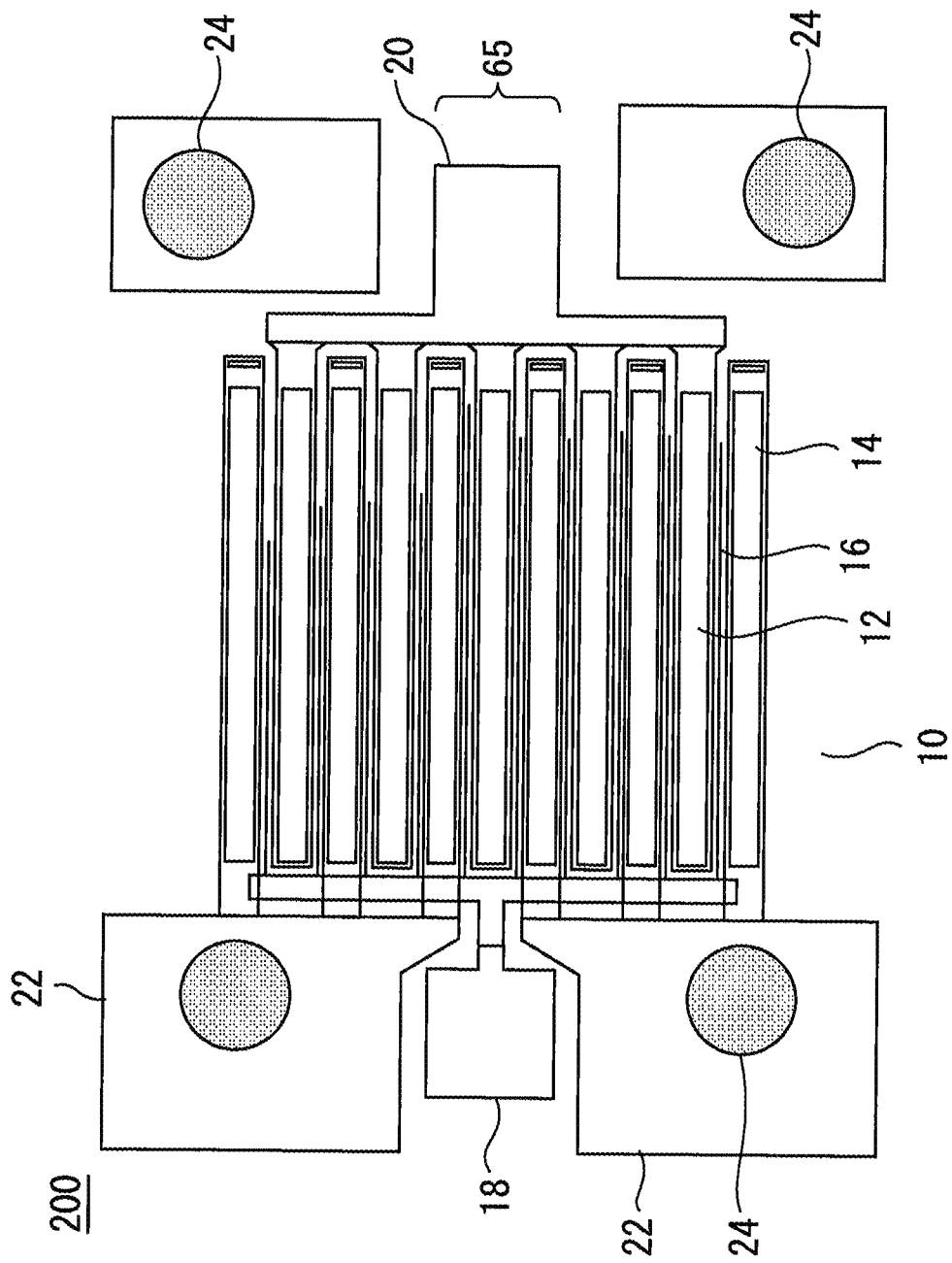
FIG. 4 is a plan view of a field-effect transistor according to a comparative example.

FIG. 4 is a plan view of a field-effect transistor 200 according to a comparative example. The plurality of metal layers 30 are not provided in the field-effect transistor 200. The other structure is the same as the structure of the field-effect transistor 100. In order to obtain a high-power output signal, when the plurality of high frequency signals amplified at the plurality of fingers respectively are combined with one another, it is necessary that the plurality of high frequency signals are in phase with one another. However, in FET in which a large number of fingers are formed, phase mismatch is likely to occur among the plurality of high frequency signals.

One of the causes is that the line length to the input/output terminal is different between a finger at the central portion and a finger at a peripheral portion in FET. As shown in FIG. 4, the input terminal 18 and the output terminal 20 are provided at the central portion 65 of the semiconductor substrate 10. Therefore, the fingers at the central portion 65 of the semiconductor substrate 10 have a shorter line length from the input terminal 18 to the output terminal 20 than the fingers at the peripheral portion of the semiconductor substrate 10. This causes a difference in electrical length between the fingers, and thus causes a phase mismatch. This phase mismatch may result in significant degradation of the output power and power addition efficiency of the large-power FET.

Here, the line length represents the physical distance of the signal line from the input terminal 18 to the output terminal 20. Furthermore, with respect the wavelength of a signal propagating through the signal line from the input terminal 18 to the output terminal 20, the electrical length means how many wavelengths of the signal the signal line corresponds to.

Next, an effect of the present embodiment will be described. When a high frequency signal is transmitted by a microwave circuit, a coplanar line may be used. In the coplanar line, a signal line made of metal and a ground metal are provided on the surface of an insulator. A cross-tie structure may be adopted in the microwave circuit. In the cross-tie structure, a plurality of metal layers crossing a signal line are periodically arranged just below the signal line like railroad ties.

Figure 5:
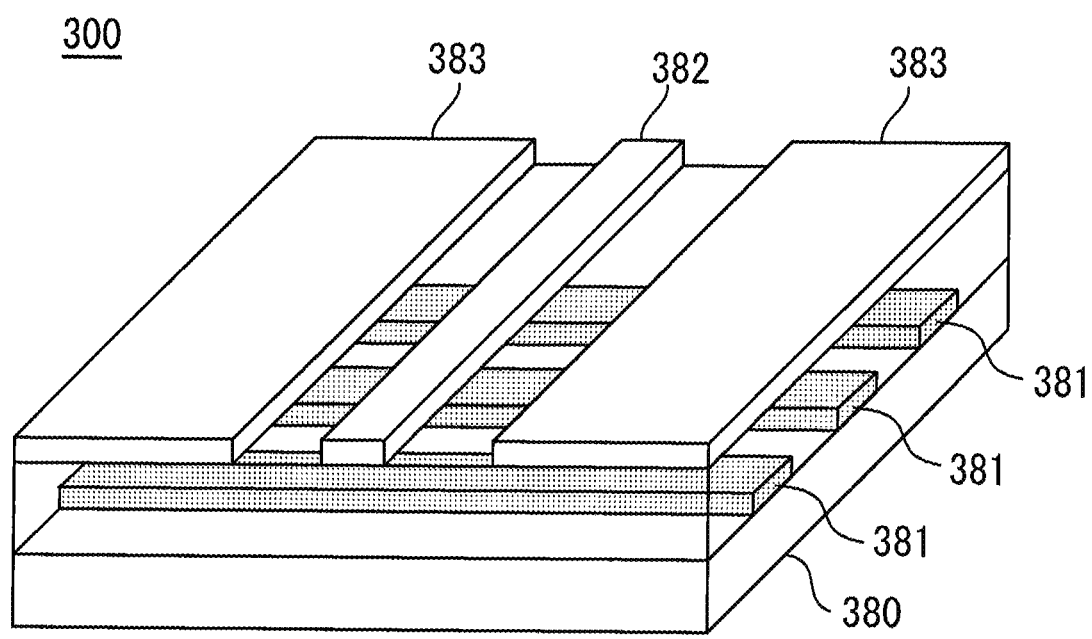
FIG. 5 is a perspective view of the slow-wave transmission line.

Furthermore, the coplanar line having the cross-tie structure is called a slow-wave transmission line. FIG. 5 is a perspective view of the slow-wave transmission line 300. The slow-wave transmission line 300 includes an insulator 380 and a plurality of metal layers 381 formed on the surface of the insulator 380. A signal line 382 and ground metals 383 are provided above the plurality of metal layers 381. The signal line 382 and the ground metals 383 are provided so as to intersect with the plurality of metal layers 381 when viewed from an upper side.

In the slow-wave transmission line 300, capacitance occurs between the signal line 382 and the metal layer 381 just below the signal line 382. Furthermore, capacitance occurs between the metal layer 381 and the ground metal 383 just above the metal layer 381. Therefore, in the slow-wave transmission line 300, the capacitance is increased as compared with the coplanar line. Here, in general, as the capacitance is larger, the electrical length of the signal line 382 is larger. Therefore, the slow-wave transmission line 300 has a longer electrical length than the coplanar line. Therefore, when a matching circuit is formed in a silicon substrate or the like in which the loss of high frequency signals is large, the matching circuit can be miniaturized by using the slow-wave transmission line. Furthermore, the loss of power can be suppressed by a shield effect of the metal layer 381.

Figure 6:
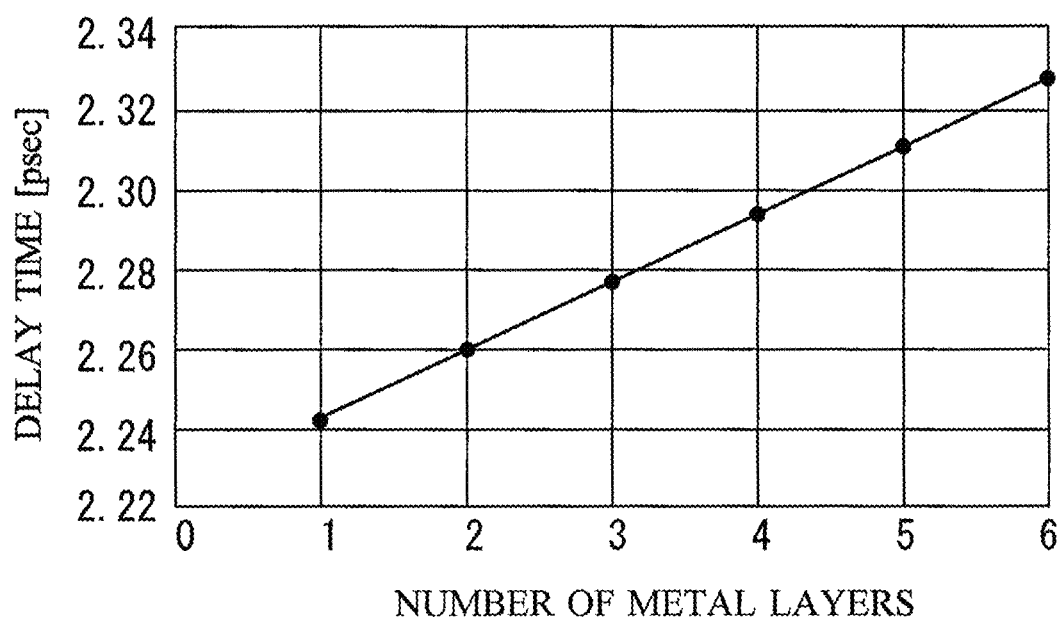
FIG. 6 is a diagram showing a calculation result of the delay time of the slow-wave transmission line with respect to the number of metal layers just below the signal line.

A simulation was performed on the delay time of the slow-wave transmission line 300. FIG. 6 is a diagram showing a calculation result of the delay time of the slow-wave transmission line 300 with respect to the number of metal layers 381 just below the signal line 382. An analysis was performed while increasing the number of metal layers 381 just below the signal line 382. In the simulation, the length of the slow-wave transmission line 300 was set to 300 micrometers. The width of each metal layer 381 was set to 30 micrometers. Furthermore, the distance between the metal layer 381 and the signal line 382 was set to 30 micrometers to perform the calculation.

As shown in FIG. 6, as the number of metal layers 381 increases, the delay time increases. In other words, when the plurality of metal layers 381 are arranged at a short period just below the signal line 382, the delay time increases. This is because the electrical length of the signal line 382 becomes long.

Here, the field-effect transistor 100 has a structure similar to the structure of the slow-wave transmission line 300 when the drain electrode 12 is regarded as the signal line 382 and the source electrode 14 is regarded as the ground metal 383. Accordingly, an effect of increasing the electrical length in the slow-wave transmission line 300 can also be obtained in the field-effect transistor 100.

Here, the electrical length in the slow-wave transmission line 300 depends on the number of metal layers 381 just below the signal line 382 and the distance between the metal layer 381 and the signal line 382. Therefore, in the field-effect transistor 100, by adjusting the number of metal layers 30 just below each drain electrode 12 according to the line length from the input terminal 18 to the output terminal 20, the phases of signals propagating through the respective drain electrodes 12 can be equalized to one another.

Next, an example of a procedure for determining the arrangement of the plurality of metal layers 30 will be described. First, measurements of the line length, etc. and electromagnetic field analysis are performed for each finger of the field-effect transistor 100. The measurements and the electromagnetic field analysis are performed on the signal lines connecting the input terminal 18, the fingers and the output terminal 20. As a result, the differences in electrical length among the plurality of fingers are calculated.

Next, the number and period of the metal layers 30 provided just below each drain electrode 12 are determined based on an analysis result shown in FIG. 6 so as to fill the differences in electrical length among the plurality of fingers. From the foregoing, the electrical lengths of the plurality of fingers can be equalized to one another, and the phase differences of the high frequency signals can be suppressed.

The distance between the metal layer 30 and the drain electrode 12 can be freely set. However, in consideration of the width of general drain electrodes and the dielectric constant of the semiconductor substrate, it is desirable that the distance between the metal layer 30 and the drain electrode 12 is equal to 60 micrometers or less. In this case, an extension effect of the electrical length can be obtained.

In the present embodiment, a drain electrode 12 having a shorter line length from the input terminal 18 to the output terminal 20 among the plurality of drain electrodes 12 is provided with a larger number of metal layers 30 just below the drain electrode 12. The plurality of metal layers 30 extend in the second direction from just below the drain electrode 12 having the shortest line length from the input terminal 18 to the output terminal 20 among the plurality of drain electrodes 12. In the present embodiment, the drain electrode 12 having the shortest line length is the drain electrode 12 provided at the central portion 65. As a result, the largest number of metal layers 30 are arranged just below the drain electrode 12 having the shortest line length.

The plurality of metal layers 30 include the first metal layer 31 and the second metal layer 32 which are different in length from each other. By arranging the plurality of first metal layers 31 and the plurality of second metal layers 32 in the first direction, the number of metal layers 30 arranged just below a drain electrode 12 farther from the central portion 65 is smaller. From the foregoing, it is possible to realize a structure in which a larger number of metal layers 30 are provided just below a drain electrode 12 having a shorter line length.

As a result, the signal is more delayed through the drain electrode 12 having a shorter line length. Therefore, the differences in line length among the plurality of drain electrodes 12 can be canceled by the delay of the signals. In other words, the electrical lengths of the plurality of drain electrodes 12 can be equalized to one another. Accordingly, the phase differences of the signals can be suppressed at the output terminal 20. As a result, the efficiency of the field-effect transistor 100 can be enhanced. In addition, the output power of the field-effect transistor 100 can be improved.

In the present embodiment, six metal layers 30 are arranged just below the drain electrodes 12 at the central portion 65. Furthermore, no metal layer 30 is arranged just below the drain electrodes 12 provided at both end portions in the second direction of the semiconductor substrate 10. Three metal layers 30 are arranged just below the drain electrodes 12 in regions sandwiched between the central portion 65 and both the end portions. As described above, in the present embodiment, the number of metal layers 30 to be arranged just below the drain electrode 12 can be changed in three stages according to the line length.

The plurality of metal layers 30 are arranged at equal intervals in the first direction. Furthermore, the plurality of first metal layers 31 and the plurality of second metal layers 32 are alternately arranged. Therefore, the plurality of metal layers 30 are provided at a shorter interval in the first direction just below the drain electrode 12 having a shorter line length among the plurality of drain electrodes 12. In other words, the plurality of metal layers 30 are arranged in a short period in the first direction just below the drain electrodes 12 at the central portion 65. Furthermore, the plurality of metal layers 30 are arranged in a longer period in the first direction just below the drain electrodes 12 at the peripheral portion as compared with the central portion 65. According to this configuration, the effect of increasing the electrical length by the plurality of metal layers 30 can be obtained in a well-balanced manner.

Here, when the electrical length of the drain electrode 12 is longer, the potential difference in the first direction is larger, so that the characteristics are easily deteriorated. In addition, oscillation is likely to occur. Therefore, it is desirable that the electrical length is short. The arrangement of the metal layer 30 below the electrode facilitates increase of parasitic capacitance. In contrast, in the present embodiment, no metal layer 30 is arranged just below the drain electrodes 12 provided at both the end portions in the second direction of the semiconductor substrate 10. As a result, the average value of electric lengths can be suppressed. Furthermore, parasitic capacitance can be suppressed. Therefore, the deterioration of the characteristics can be suppressed.

In the case of a high power FET having a large number of fingers, a combination loss effect caused by the phase mismatch of the high frequency signals is large. Therefore, even when an increase in parasitic capacitance or the like occurs due to the metal layers 30, the effect of suppressing the combination loss by the equalization of the electrical lengths more greatly contributes to the characteristics of the field-effect transistor 100. Therefore, by providing the plurality of metal layers 30, the performance of the field-effect transistor 100 can be enhanced.

In the present embodiment, there is no need to provide a matching circuit to suppress the phase difference of signals. Accordingly, the field-effect transistor 100 can be miniaturized.

Furthermore, by providing the plurality of metal layers 30 to the semiconductor substrate 10, heat generated in each finger by the amplification operation can be efficiently dissipated. Accordingly, reliability of the field-effect transistor 100 can be enhanced. In particular, when gallium arsenide or indium phosphide having a low thermal conductivity is used for the semiconductor substrate 10, the reliability can be enhanced by increasing the heat dissipation property to the second surface 13 side.

Note that, in order to secure the capacitance between the metal layer 30 and the drain electrode 12, it is better to provide the plurality of metal layers 30 on the second surface 13 side of the semiconductor substrate 10 rather than an active layer in which the drains, the sources and the like are provided. At this time, the plurality of metal layers 30 are separated from the first surface 11 by a portion having a higher resistance value than the active layer of the semiconductor substrate 10.

As a modification of the present embodiment, the first direction and the second direction may not be perpendicular to each other. In other words, the plurality of metal layers 30 may be inclined with respect to the direction perpendicular to the first direction. Furthermore, the numbers of drain electrodes 12, source electrodes 14 and gate electrodes 16 provided in the field-effect transistor 100 are not limited to those shown in FIG. 1.

Although the field-effect transistor 100 includes the three first metal layers 31 and the three second metal layers 32 in the present embodiment, the numbers of the first metal layers 31 and the second metal layers 32 are not limited to these numbers. The arrangement of the plurality of first metal layers 31 and the plurality of second metal layers 32 is not limited to the arrangement shown in the present embodiment. For example, a plurality of second metal layers 32 may be arranged between a pair of first metal layers 31. Furthermore, a plurality of first metal layers 31 may be arranged between a pair of second metal layers 32. The plurality of first metal layers 31 and the plurality of second metal layers 32 may not be periodically arranged.

The plurality of metal layers 30 of the present embodiment include metal layers 30 of two types of lengths. As a modification of this embodiment, the plurality of metal layers 30 may include metal layers 30 of three or more types of lengths. In this case, the number of metal layers 30 arranged just below each drain electrode 12 can be set in three or more stages depending on the line length. Accordingly, the phase difference of the signals can be further suppressed.

The input terminal 18 and the output terminal 20 may be provided out of the central portion 65. For example, the input terminal 18 and the output terminal 20 may be arranged at the peripheral portion of the semiconductor substrate 10. In this case, the drain electrode 12 having the shortest line length is a drain electrode 12 at the peripheral portion which is provided contiguously to the input terminal 18 and the output terminal 20. In this case, the plurality of metal layers 30 extend in the second direction from just below the drain electrode 12 at the peripheral portion.

These modifications can be applied, as appropriate, to a field-effect transistor according to the following embodiments. Note that the field-effect transistor according to the following embodiments are similar to those of the first embodiment in many respects, and thus differences between the field-effect transistor according to the following embodiments and those of the first embodiment will be mainly described below.

Second Embodiment

Figure 7:
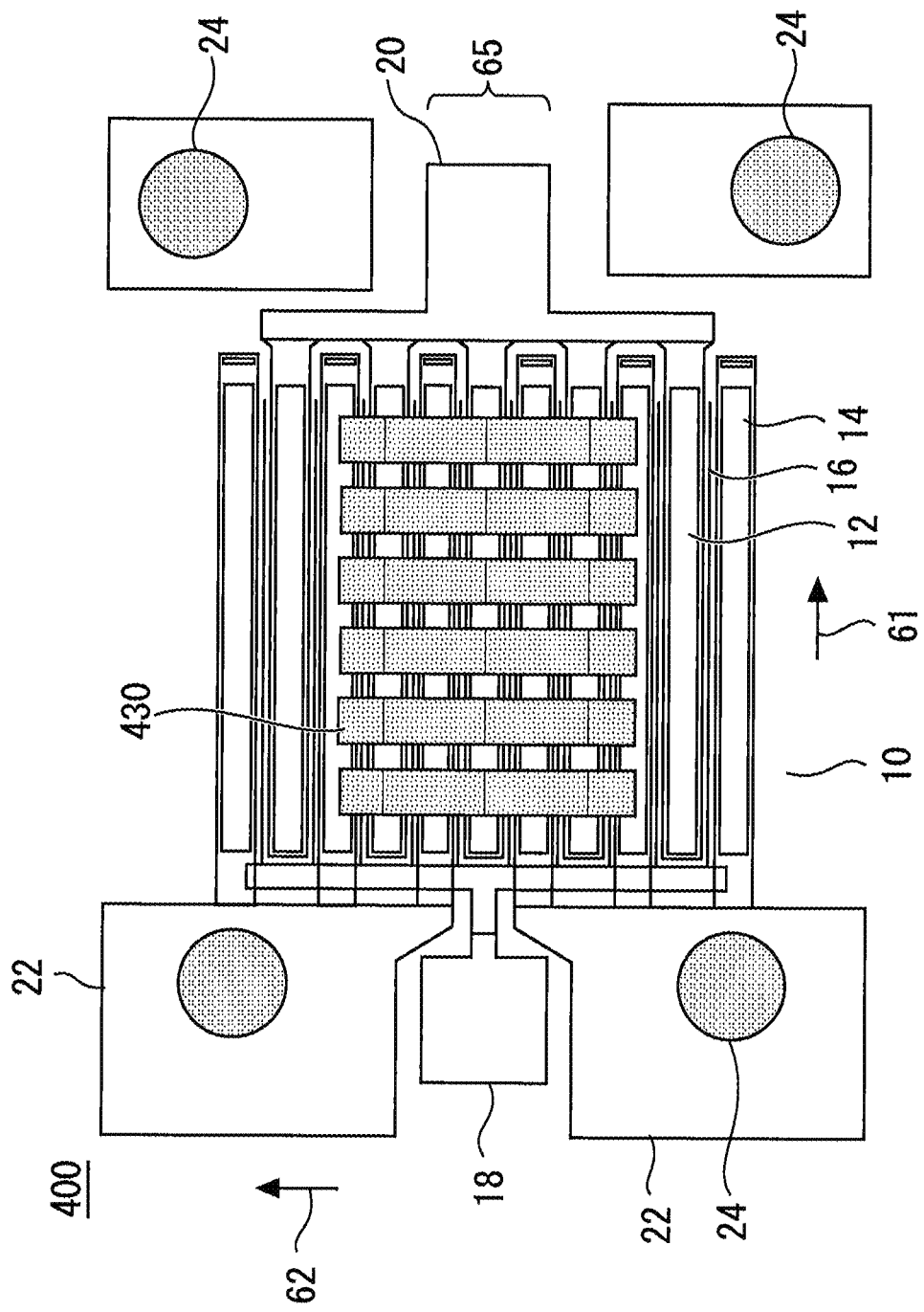
FIG. 7 is a plan view of a field-effect transistor according to a second embodiment.

FIG. 7 is a plan view of a field-effect transistor 400 according to a second embodiment. The field-effect transistor 400 is different from the field-effect transistor 100 in the shapes of the plurality of metal layers 430. The other structure is similar to the structure of the field-effect transistor 100. The field-effect transistor 400 includes a plurality of metal layers 430. The shapes of the plurality of metal layers 430 are equal to one another.

Figure 8:
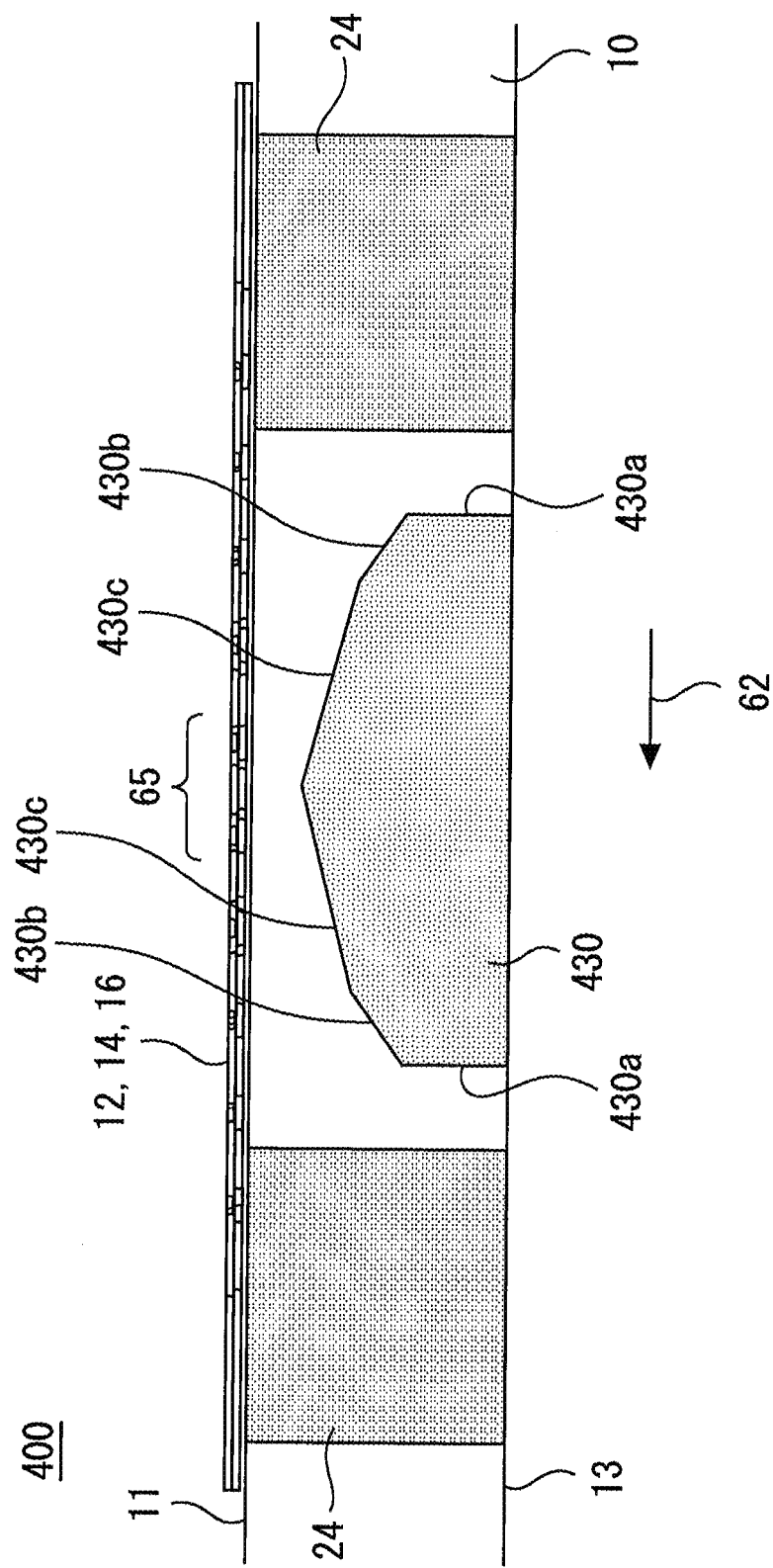
FIG. 8 is a cross-sectional view of the field-effect transistor according to the second embodiment which is taken along the second direction.
Figure 9:
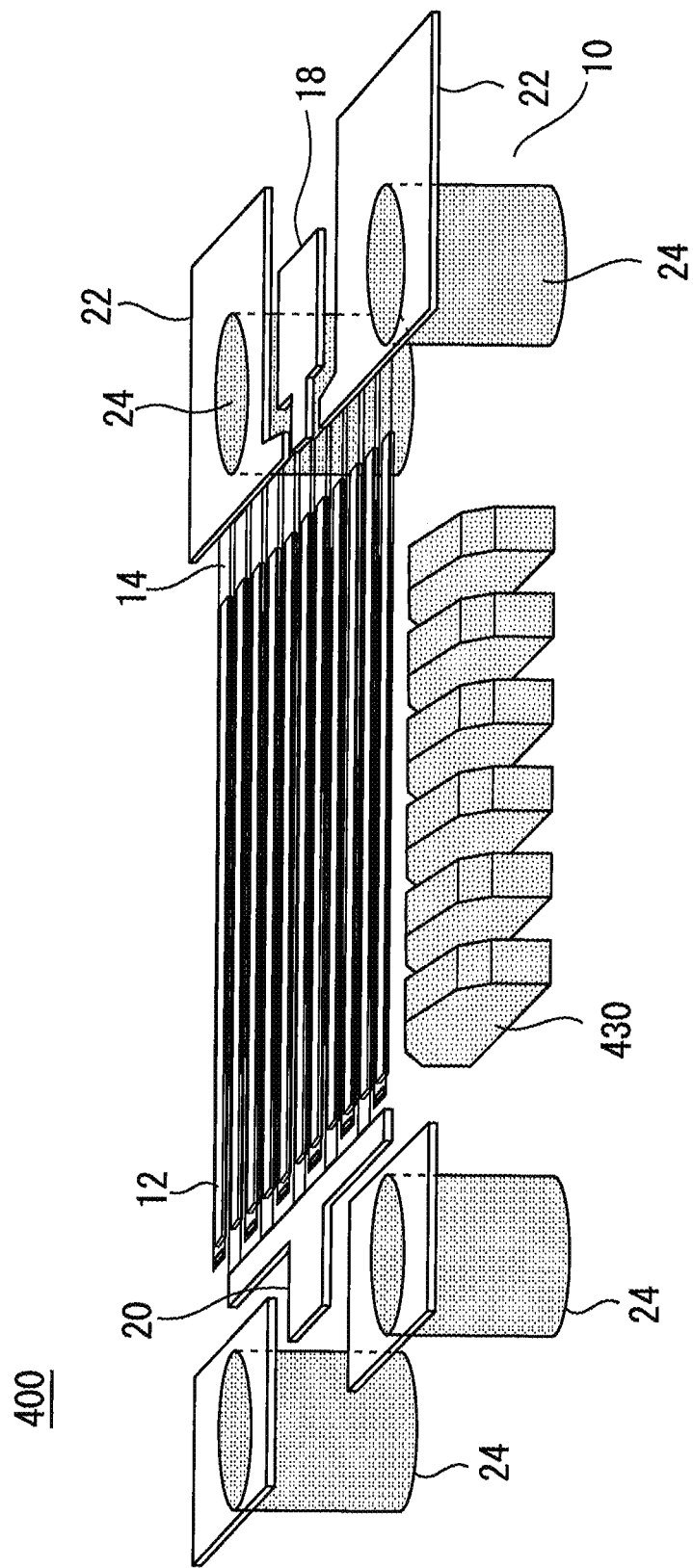
FIG. 9 is a perspective view of the field-effect transistor according to the second embodiment.

FIG. 8 is a cross-sectional view of the field-effect transistor 400 according to the second embodiment which is taken along the second direction. FIG. 9 is a perspective view of the field-effect transistor 400 according to the second embodiment. The height of each of the plurality of metal layers 430 in a direction perpendicular to the first surface 11 changes along the second direction. The height of each of the plurality of metal layers 430 decreases as the metal layer 430 is farther away from the central portion 65 in the second direction. Note that the gate electrodes 16 are omitted in FIG. 9.

The surface of each metal layer 430 includes paired first metal surfaces 430a, paired second metal surfaces 430b, and paired third metal surfaces 430c. The paired first metal surfaces 430a extend perpendicularly to the second surface 13. The paired second metal surfaces 430b extend from end portions of the paired first metal surfaces 430a which are opposite to the second surface 13, respectively. The paired second metal surfaces 430b are inclined toward the central portion 65 with respect to the paired first metal surfaces 430a. The paired third metal surfaces 430c extend from end portions of the paired second metal surfaces 430b which are opposite to the paired first metal surfaces 430a. The paired third metal surfaces 430c are inclined toward the central portion 65 with respect to the paired second metal surfaces 430b. The paired third metal surfaces 430c are connected to each other at the central portion 65.

The distance between each of the plurality of metal layers 430 and the first surface 11 increases as the metal layer 430 is farther away from the central portion 65 in the second direction. Each of the plurality of metal layers 430 is an unpenetrated via hole which is processed more deeply just below the finger at the central portion 65 than that at the peripheral portion of the semiconductor substrate 10.

Figure 10:
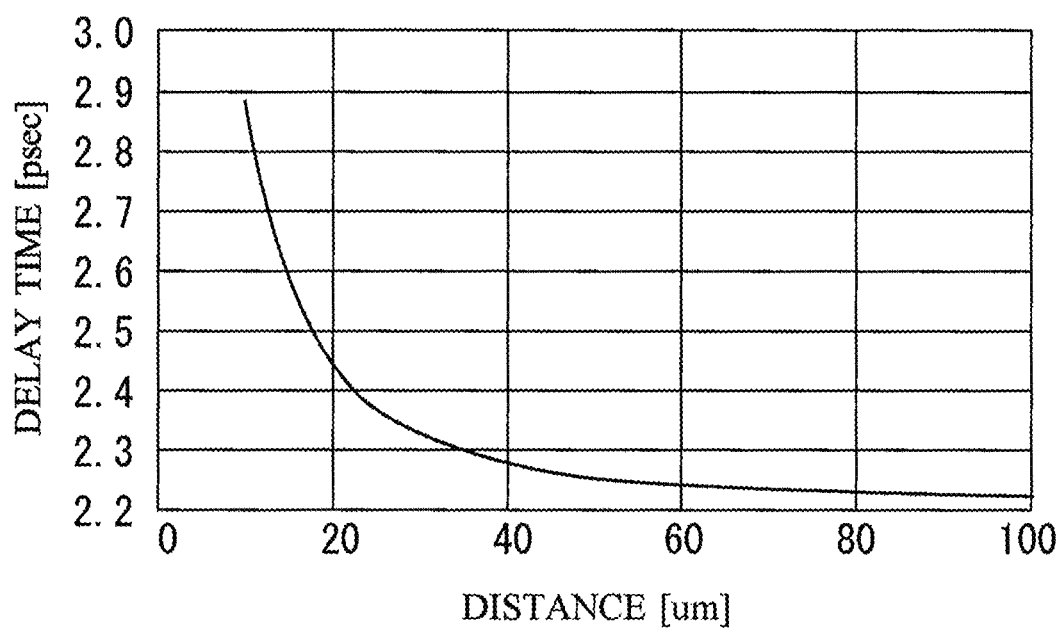
FIG. 10 is a diagram showing a calculation result of the delay time of the slow-wave transmission line with respect to the distance between the metal layer and the signal line.

Next, an effect of the present embodiment will be described. The extension effect of the electrical length by the slow-wave transmission line varies depending on not only the number of the plurality of metal layers just below the signal line, but also the distance between the signal line and the plurality of metal layers. FIG. 10 is a diagram showing a calculation result of the delay time of the slow-wave transmission line with respect to the distance between the metal layer and the signal line. In a simulation of the delay time, the length of the slow-wave transmission line was set to 300 micrometers. Also, the width of the metal layer was set to 30 micrometers. Furthermore, six metal layers were arranged at equal intervals just below the signal line.

As shown in FIG. 10, an analysis result indicating that the delay time increased as the plurality of metal layers were closer to the signal line was obtained. This is because the capacitance of the signal line increases and the electrical length increases as the plurality of metal layers are closer to the signal line. As described above, in the present embodiment, by adjusting the distance between the plurality of metal layers 430 and the plurality of drain electrodes 12 according to the line length, the electrical lengths of the plurality of drain electrodes 12 can be equalized to one another. As a result, by adjusting the heights of the plurality of metal layers 430, the phase differences of the high frequency signals at the output terminal 20 can be suppressed.

Means for quantitatively determining the distance between each drain electrode 12 and the plurality of metal layers 430 will be described. First, as in the case of the first embodiment, the differences in electrical length among a plurality of fingers are estimated. Next, the distance between each drain electrode 12 and the plurality of metal layers 430 is determined based on the analysis result of FIG. 10 so that the electrical lengths of the plurality of fingers are equalized to one another. From the foregoing, the phase differences of the high frequency signals can be suppressed, so that the output power and power addition efficiency of the field-effect transistor 400 can be enhanced. Note that it is desirable that the distance between the plurality of metal layers 430 and the drain electrode 12 is equal to 60 micrometers or less.

In the present embodiment, at the central portion 65 in which the line length from the input terminal 18 to the output terminal 20 is short, the plurality of metal layers 430 and the plurality of drain electrodes 12 are made closer to each other as compared to the peripheral portion. As a result, the electrical length is increased by the fingers at the central portion 65. Conversely, at the peripheral portion of the semiconductor substrate 10 in which the line length from the input terminal 18 to the output terminal 20 is long, the distance between the plurality of metal layers 430 and the plurality of drain electrodes 12 is increased as compared to the central portion 65. As a result, the increase of the electrical length is suppressed by the fingers at the peripheral portion.

As described above, in the present embodiment, as a drain electrode 12 has a shorter line length from the input terminal 18 to the output terminal 20 among the plurality of drain electrodes 12, the distance between the drain electrode 12 and the plurality of metal layers 430 is shorter. As a result, the signal is more delayed in the drain electrode 12 having the shorter line length. Therefore, the differences in line length among the plurality of drain electrodes 12 can be canceled by the delay of signals. In other words, the phase differences of the signals can be suppressed at the output terminal 20. Therefore, the efficiency of the field-effect transistor 400 can be enhanced.

In the present embodiment, the heights of the plurality of metal layers 430 can be adjusted by changing the processing time of the semiconductor substrate 10 or the processing rate of the semiconductor substrate 10. Therefore, metal layers 430 having a plurality of shapes can be formed by using one processing mask. Therefore, in order to change the shape of the metal layer 430, it is not necessary to prepare a new processing mask. This makes it easier to experimentally find appropriate shapes for the metal layers 430.

The shape of each metal layer 430 is not limited to that shown in FIG. 8. Any shape in which the distance between the drain electrode 12 and the plurality of metal layers 430 is shorter as the drain electrode 12 has a shorter line length can be adopted as the shape of each metal layer 430. For example, the surface of the metal layer 430 may include a curved surface. Furthermore, the metal layer 430 may be triangular in a cross-sectional view perpendicular to the first direction.

Third Embodiment

FIG. 11 is a cross-sectional view of a field-effect transistor 500 according to the third embodiment which is taken along the second direction. The field-effect transistor 500 is different from the field-effect transistor 100 in the shapes of the plurality of metal layers 530. The other structure is similar to the structure of the field-effect transistor 100. The plurality of metal layers 530 are provided apart from the second surface 13 of the semiconductor substrate 10. The plurality of metal layers 530 are separated from a back surface metal provided on the second surface 13 of the semiconductor substrate 10.

As described above, the source electrode 14 can be regarded as the ground metal of the coplanar line. At this time, the source electrode 14 and the metal layer 530 inside the semiconductor substrate 10 are electrically coupled to each other. As a result, the extension effect of the electrical length can be obtained. Here, when the metal layer 530 is separated from the back surface metal, the extension effect of the electrical length is weakened as compared with the first and second embodiments. However, the increase in parasitic capacitance is suppressed by separating the metal layer 530 from the back surface metal. Therefore, when it is desired to suppress an increase in parasitic capacitance due to the plurality of metal layers 530, as shown in FIG. 11, the plurality of metal layers 530 and the second surface 13 may be separated from each other.

Next, a method of forming the metal layers 530 will be described. First, the semiconductor substrate 10 is processed till a predetermined depth from the second surface 13 to the first surface 11 to form holes. Next, the holes are filled with metal until positions where the metal does not connect with the back surface metal. Alternatively, plating may be formed inside the holes. From the foregoing, the metal layers 530 separated from the back surface metal can be formed. After the metal is filled inside the holes, the holes may be further filled with an insulator until the same height as the second surface 13. As a result, degradation in mechanical strength caused by formation of hollow portions can be prevented.

Note that the technical features described in the above embodiments may be combined as appropriate.

REFERENCE SIGNS LIST

100,400,500 field-effect transistor, 10 semiconductor substrate, 11 first surface, 12 drain electrode, 13 second surface, 14 source electrode, 16 gate electrode, 18 input terminal, 20 output terminal, 30,430,530 metal layer, 31 first metal layer, 32 second metal layer, 65 central portion

The invention claimed is:

1. A field-effect transistor comprising:
   a semiconductor substrate;
   a plurality of drain electrodes that are provided on a first surface of the semiconductor substrate and extend in a first direction;
   a plurality of source electrodes that are provided on the first surface of the semiconductor substrate, extend in the first direction, and are alternately arranged with each other with the plurality of drain electrodes;
   a plurality of gate electrodes that are provided on the first surface of the semiconductor substrate, extend in the first direction, and are provided between the plurality of source electrodes and the plurality of drain electrodes, respectively;
   an input terminal connected to the plurality of gate electrodes;

an output terminal connected to the plurality of drain electrodes; and a plurality of metal layers that are provided in the semiconductor substrate apart from the first surface, extend in a second direction intersecting the first direction, and intersect the plurality of drain electrodes when viewed in a direction perpendicular to the first surface, wherein the plurality of metal layers include a first metal layer, and a second metal layer which is longer than the first metal layer and intersects a larger number of drain electrodes than the first metal layer when viewed in a direction perpendicular to the first surface, and a larger number of metal layers are provided just below a drain electrode having a shorter line length from the input terminal to the output terminal among the plurality of drain electrodes.

2. The field-effect transistor according to claim 1, wherein the plurality of metal layers extend in the second direction from just below a drain electrode having a shortest line length among the plurality of drain electrodes.

3. The field-effect transistor according to claim 1, wherein the input terminal and the output terminal are provided at a central portion in a direction perpendicular to the first direction of the semiconductor substrate so as to sandwich the plurality of drain electrodes therebetween, and the plurality of metal layers extend from just below a drain electrode provided at the central portion to both sides in the second direction.

4. The field-effect transistor according to claim 1, wherein the plurality of metal layers are arranged at equal intervals in the first direction, and the plurality of metal layers are arranged at a shorter interval in the first direction just below a drain electrode having a shorter line length among the plurality of drain electrodes.

5. The field-effect transistor according to claim 1, wherein the plurality of metal layers includes a plurality of the first metal layers and a plurality of the second metal layers, and the plurality of the first metal layers and the plurality of the second metal layers are alternately arranged with each other in the first direction.

6. A field-effect transistor comprising:

a semiconductor substrate;

a plurality of drain electrodes that are provided on a first surface of the semiconductor substrate and extend in a first direction;

a plurality of source electrodes that are provided on the first surface of the semiconductor substrate, extend in the first direction, and are alternately arranged with each other with the plurality of drain electrodes;

a plurality of gate electrodes that are provided on the first surface of the semiconductor substrate, extend in the first direction, and are provided between the plurality of source electrodes and the plurality of drain electrodes, respectively, an input terminal connected to the plurality of gate electrodes;

an output terminal connected to the plurality of drain electrodes; and a plurality of metal layers that are provided in the semiconductor substrate apart from the first surface, extend in a second direction intersecting the first direction, and intersect the plurality of drain electrodes when viewed in a direction perpendicular to the first surface, wherein a distance between a drain electrode and the plurality of metal layers is shorter as the drain electrode has a shorter line length from the input terminal to the output terminal among the plurality of drain electrodes.

7. The field-effect transistor according to claim 6, wherein a height of each of the plurality of metal layers in a direction perpendicular to the first surface changes along the second direction.

8. The field-effect transistor according to claim 7, wherein the input terminal and the output terminal are provided at a central portion in a direction perpendicular to the first direction of the semiconductor substrate so as to sandwich the plurality of drain electrodes therebetween, and each of the plurality of metal layers decreases in height as the metal layer is farther away from the central portion in the second direction.

9. The field-effect transistor according to claim 1, wherein the plurality of metal layers are provided on a second surface which is a surface opposite to the first surface of the semiconductor substrate.

10. The field-effect transistor according to claim 1, wherein the plurality of metal layers are provided apart from a second surface which is a surface opposite to the first surface of the semiconductor substrate.

11. The field-effect transistor according to claim 6, wherein the plurality of metal layers are provided on a second surface which is a surface opposite to the first surface of the semiconductor substrate.

12. The field-effect transistor according to claim 6, wherein the plurality of metal layers are provided apart from a second surface which is a surface opposite to the first surface of the semiconductor substrate.

* * * * *